(12) United States Patent
Kim et al.

(10) Patent No.: US 11,126,081 B2
(45) Date of Patent: *Sep. 21, 2021

(54) PHOTOPOLYMER COMPOSITION

(71) Applicant: LG CHEM, LTD., Seoul (KR)

(72) Inventors: Boo Kyung Kim, Daejeon (KR); Heon Kim, Daejeon (KR); Seok Hoon Jang, Daejeon (KR); Yeong Rae Chang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 27 days.

This patent is subject to a terminal disclaimer.

(21) Appl. No.: 16/473,992

(22) PCT Filed: Mar. 14, 2018

(86) PCT No.: PCT/KR2018/003002
§ 371 (c)(1),
(2) Date: Jun. 26, 2019

(87) PCT Pub. No.: WO2018/199467
PCT Pub. Date: Jan. 11, 2018

(65) Prior Publication Data
US 2019/0339612 A1 Nov. 7, 2019

(30) Foreign Application Priority Data

Apr. 25, 2017 (KR) ........................ 10-2017-0053106

(51) Int. Cl.
| | |
|---|---|
| *G03H 1/02* | (2006.01) |
| *G03F 7/004* | (2006.01) |
| *C08F 220/18* | (2006.01) |
| *C08F 299/04* | (2006.01) |
| *C08G 18/40* | (2006.01) |
| *C08G 18/62* | (2006.01) |
| *G03F 7/00* | (2006.01) |
| *C08G 18/72* | (2006.01) |

(52) U.S. Cl.
CPC ............ *G03F 7/001* (2013.01); *C08F 220/18* (2013.01); *C08F 299/0435* (2013.01); *C08G 18/40* (2013.01); *C08G 18/6229* (2013.01); *C08G 18/72* (2013.01); *G03H 1/02* (2013.01); *C08F 220/1804* (2020.02); *G03H 2260/12* (2013.01)

(58) Field of Classification Search
CPC ........ C08F 2/50; C08F 220/18; C08F 220/26; C08F 220/286; C08F 220/1804; C08F 220/14; C08F 220/20; C08F 283/006; C08F 299/0435; C08F 222/1006; C08F 222/103; C08F 222/102; C08F 2260/12; C08G 18/6229; C08G 18/72; C09D 175/16; C09D 175/14; C09D 4/16; C09D 4/00; C09D 4/06; G03F 7/001; G03F 7/035; G03F 7/027; G03H 1/02; G03H 1/0248; G03H 2260/12; G03H 2260/14; G03H 2240/24; G03H 2240/54; C08L 75/14; G11B 7/24044; G11B 7/245
See application file for complete search history.

(56) References Cited

U.S. PATENT DOCUMENTS

| | | | | |
|---|---|---|---|---|
| 4,942,102 A | * | 7/1990 | Keys ................. | B32B 17/10036 430/1 |
| 2004/0067323 A1 | * | 4/2004 | Clabburn .............. | G03F 7/0755 428/1.26 |
| 2005/0058911 A1 | * | 3/2005 | Takeyama ............... | G03F 7/001 430/1 |
| 2009/0053615 A1 | * | 2/2009 | Tomari .................... | G03F 7/001 430/2 |
| 2009/0062419 A1 | * | 3/2009 | Stockel ................ | C08G 18/638 522/109 |
| 2012/0219884 A1 | | 8/2012 | Weiser et al. | |
| 2012/0231377 A1 | | 9/2012 | Weiser et al. | |
| 2015/0125784 A1 | | 5/2015 | Weiser et al. | |
| 2016/0280829 A1 | * | 9/2016 | Uchigasaki ........... | C08F 265/06 |
| 2019/0185592 A1 | * | 6/2019 | Kim ................... | C08G 18/3212 |
| 2019/0317404 A1 | * | 10/2019 | Jang ......................... | C08L 43/04 |
| 2020/0150528 A1 | * | 5/2020 | Jang ......................... | C08L 75/04 |
| 2020/0255623 A1 | * | 8/2020 | Jang ................... | C08G 18/6229 |
| 2020/0263038 A1 | * | 8/2020 | Kim ....................... | G03F 7/0758 |
| 2020/0354497 A1 | * | 11/2020 | Kim ..................... | G11B 7/2535 |
| 2020/0355996 A1 | * | 11/2020 | Kim ................. | C08F 220/1804 |
| 2021/0026239 A1 | * | 1/2021 | Kim .......................... | G03H 1/02 |

FOREIGN PATENT DOCUMENTS

| | | | | |
|---|---|---|---|---|
| JP | 2000-344716 | * | 12/2000 | .............. C08F 20/30 |
| JP | 2002-293762 | * | 10/2002 | ............... G02B 1/04 |
| JP | 2005-181955 | * | 7/2005 | |
| JP | 2005189720 A | | 7/2005 | |
| JP | 2012082386 A | | 4/2012 | |
| JP | 2013510204 A | | 3/2013 | |
| JP | 2013231153 A | | 11/2013 | |
| JP | 2014063104 A | | 4/2014 | |
| KR | 1020050069135 A | | 7/2005 | |
| KR | 1020060078556 A | | 7/2006 | |

(Continued)

OTHER PUBLICATIONS

Machine translation of JP 2005-181955 (2005).*

(Continued)

*Primary Examiner* — Martin J Angebranndt
(74) *Attorney, Agent, or Firm* — Dentons US LLP

(57) ABSTRACT

The present disclosure relates to a photopolymer composition including: a polymer matrix or a precursor thereof; a photoreactive monomer including a polyfunctional (meth) acrylate monomer having a refractive index of 1.5 or less and a viscosity at 25° C. of 100 cps or less, and a monofunctional (meth)acrylate monomer having a refractive index of 1.5 or more; and a photoinitiator, wherein a content of the monofunctional (meth)acrylate monomer having a refractive index of 1.5 or more in the photoreactive monomer is 60 wt % or more. The present disclosure also relates to a hologram recording medium produced from the photopolymer composition, an optical element including the hologram recording medium, and a holographic recording method using the photopolymer composition.

16 Claims, No Drawings

(56) References Cited

FOREIGN PATENT DOCUMENTS

| | | |
|---|---|---|
| KR | 1020100022910 A | 3/2010 |
| KR | 10-2011-0115324 A | 10/2011 |
| KR | 1020120101431 A | 9/2012 |
| KR | 1020130006421 A | 1/2013 |
| KR | 102010049584 A | 4/2014 |
| KR | 1020150120627 A | 10/2015 |
| KR | 1020170015904 A | 2/2017 |
| WO | 02/39185 A1 | 5/2002 |
| WO | 2008015983 A1 | 2/2008 |

OTHER PUBLICATIONS

Machine translation of JP 2013-231153 (2013).*
Machine translation of JP 2002-293762 (2002).*
Machine transaltino of JP 2000-344716 (2000).*

* cited by examiner

PHOTOPOLYMER COMPOSITION

CROSS-REFERENCE TO RELATED APPLICATION

This application is a national stage of International Application No. PCT/KR2018/003002 filed Mar. 14, 2018, which claims the benefits of Korean Patent Application No. 10-2017-0053106 filed on Apr. 25, 2017, with the Korean Intellectual Property Office, the disclosures of which are incorporated herein by reference in their entirety.

TECHNICAL FIELD

The present disclosure relates to a photopolymer composition, a hologram recording medium, an optical element, and a holographic recording method.

BACKGROUND OF ART

A hologram recording medium records information by changing a refractive index in a holographic recording layer in the medium through an exposure process, reads the variation of refractive index in the medium thus recorded, and reproduces the information.

When a photopolymer (photosensitive resin) is used, the light interference pattern can be easily stored as a hologram by photopolymerization of the low molecular weight monomer. Therefore, the photopolymer can be used in various fields such as for optical lenses, mirrors, deflecting mirrors, filters, diffusing screens, diffraction elements, light guides, waveguides, holographic optical elements having projection screen and/or mask functions, media of optical memory systems and light diffusion plates, optical wavelength multiplexers, reflection type and transmission type color filters, and the like.

Typically, a photopolymer composition for hologram production includes a polymer binder, a monomer, and a photoinitiator, and a photosensitive film produced from such a composition is irradiated with laser interference light to induce photopolymerization of local monomers.

In a portion where a relatively large number of monomers are present in such photopolymerization process, the refractive index becomes high. Further, in a portion where a relatively large number of polymer binders are present, the refractive index is relatively lowered and thus refractive index modulation occurs, and a diffraction grating is generated by such refractive index modulation. The refractive index modulation value ($\Delta n$) is influenced by the thickness and the diffraction efficiency (DE) of the photopolymer layer, and the angular selectivity increases as the thickness decreases.

Recently, development of materials capable of maintaining a stable hologram with high diffraction efficiency has been demanded, and also various attempts have been made to manufacture a photopolymer layer having a thin thickness and a high refractive index modulation value.

DETAILED DESCRIPTION OF THE INVENTION

Technical Problem

The present disclosure is to provide a photopolymer composition which can more easily provide a photopolymer layer having a high refractive index modulation value even with a thin thickness.

The present disclosure is also to provide a hologram recording medium including a photopolymer layer having a high refractive index modulation value even with a thin thickness.

The present disclosure is also to provide an optical element including the above-described hologram recording medium.

The present disclosure is also to provide a holographic recording method including selectively polymerizing photoreactive monomers contained in the photopolymer composition using electromagnetic radiation.

Technical Solution

The present disclosure provides a photopolymer composition including: a polymer matrix or a precursor thereof; a photoreactive monomer including a polyfunctional (meth)acrylate monomer having a refractive index of 1.5 or less and a viscosity at 25° C. of 100 cps or less, and a monofunctional (meth)acrylate monomer having a refractive index of 1.5 or more; and a photoinitiator, wherein a content of the monofunctional (meth)acrylate monomer having a refractive index of 1.5 or more in the photoreactive monomer is 60 wt % or more.

The present disclosure also provides a hologram recording medium produced from the photopolymer composition.

In addition, the present disclosure provides an optical element including the hologram recording medium.

The present disclosure also provides a holographic recording method including selectively polymerizing photoreactive monomers contained in the photopolymer composition using electromagnetic radiation.

Hereinafter, the photopolymer composition, the hologram recording medium, the optical element, and the holographic recording method according to a specific embodiment of the present invention will be described in more detail.

As used herein, the term "(meth)acrylate" refers to either methacrylate or acrylate.

Further, the term "hologram" as used herein refers to a recording medium in which optical information is recorded in an entire visible range and a near ultraviolet range (300 to 800 nm) through an exposure process, and examples thereof include all of visual holograms such as in-line (Gabor) holograms, off-axis holograms, full-aperture transfer holograms, white light transmission holograms ("rainbow holograms"), Denisyuk holograms, off-axis reflection holograms, edge-lit holograms, and holographic stereograms.

According to an embodiment of the present disclosure, a photopolymer composition is provided, including: a polymer matrix or a precursor thereof; a photoreactive monomer including a polyfunctional (meth)acrylate monomer having a refractive index of 1.5 or less and a viscosity at 25° C. of 100 cps or less, and a monofunctional (meth)acrylate monomer having a refractive index of 1.5 or more; and a photoinitiator, wherein a content of the monofunctional (meth)acrylate monomer having a refractive index of 1.5 or more in the photoreactive monomer is 60 wt % or more.

The present inventors found through experiments that holograms produced by using a polyfunctional recording monomer having a relatively low refractive index and a low viscosity at room temperature and a monofunctional recording monomer having a relatively high refractive index with the monofunctional monomer in a predetermined amount or more can exhibit a significantly improved refractive index modulation value as compared with the existing holograms even with a thin thickness, thereby completing the present invention.

More specifically, the photopolymer composition includes a photoreactive monomer including a polyfunctional (meth)acrylate monomer having a refractive index of 1.5 or less and a viscosity at 25° C. of 100 cps or less, or 90 cps or less, and a monofunctional (meth)acrylate monomer having a refractive index of 1.5 or more, and a content of the monofunctional (meth)acrylate monomer having a refractive index of 1.5 or more in the photoreactive monomer is 60 wt % or more, or 65 wt % or more. Accordingly, the hologram produced from the photopolymer composition can exhibit a refractive index modulation value ($\Delta n$) of 0.01 or more, or 0.0120 or more, even at a thickness of 5 μm to 30 μm.

In particular, the photopolymer composition includes a polyfunctional (meth)acrylate monomer having a viscosity 25° C. of 100 cps or less, or 90 cps or less, and this polyfunctional acrylate can increase the cross-linking point to compensate for the low cross-linking density of the monofunctional (meth)acrylate which is used for improving the refractive index.

The photopolymer composition includes 60 wt % or more, 65 wt % or more, or 70 wt % to 90 wt % of the monofunctional (meth)acrylate monomer having a relatively high refractive index in the photoreactive monomer, thereby increasing a difference in the refractive index with respect to the binder. Accordingly, as described above, the hologram produced from the photopolymer composition can achieve a refractive index modulation value ($\Delta n$) of 0.0100 or more, or 0.0120 or more, even at a thickness of 5 μm to 30 μm.

Meanwhile, the monofunctional (meth)acrylate monomer having a refractive index of 1.5 or more may have a relatively high viscosity as compared with the polyfunctional (meth)acrylate monomer. Specifically, the monofunctional (meth)acrylate monomer having a refractive index of 1.5 or more may have a viscosity at 25° C. of 300 cps or less, or 100 cps to 300 cps.

As the photoreactive monomer, a (meth)acrylate-based α,β-unsaturated carboxylic acid derivative such as (meth)acrylate, (meth)acrylamide, (meth)acrylonitrile, or (meth)acrylic acid may be used.

More specifically, the polyfunctional (meth)acrylate monomer having a refractive index of 1.5 or less and a viscosity at 25° C. of 100 cps or less, or 90 cps or less, may include an ether bond and a fluorene functional group in the molecule. Specific examples of the polyfunctional (meth)acrylate monomer having a refractive index of 1.5 or less and a viscosity at 25° C. of 100 cps or less, or 90 cps or less, include polyethylene glycol di(meth)acrylate, trimethylpropane (ethylene oxide) tri(meth)acrylate, and the like.

In addition, the monofunctional (meth)acrylate monomer having a refractive index of 1.5 or more may include an ether bond and a fluorene functional group in the molecule. Specific examples of the monofunctional (meth)acrylate monomer having a refractive index of 1.5 or more include phenoxybenzyl (meth)acrylate, o-phenylphenol ethylene oxide (meth)acrylate, benzyl (meth)acrylate, 2-(phenylthio)ethyl (meth)acrylate, biphenylmethyl (meth)acrylate, and the like.

Each of the polyfunctional (meth)acrylate monomer having a refractive index of 1.5 or less and a viscosity at 25° C. of 100 cps or less, or 90 cps or less, and the monofunctional (meth)acrylate monomer having a refractive index of 1.5 or more, may have a weight average molecular weight of 50 to 1000 g/mol, or 200 to 600 g/mol. The weight average molecular weight refers to a weight average molecular weight using polystyrene calibration measured by a GPC method.

The glass transition temperature of the polyfunctional (meth)acrylate monomer and the monofunctional (meth)acrylate monomer can be measured by differential scanning calorimetry or by a commonly known method.

The polymer matrix may serve as a support for the photopolymer composition and a final product produced therefrom such as a film, and may increase the refractive index modulation of the hologram produced from the photopolymer composition due to a difference in the refractive index.

The polymer matrix may be a reaction product of a compound having at least one isocyanate group and a polyol.

The compound having at least one isocyanate group may be a known compound having an average of at least one NCO functional group per molecule, or a mixture thereof, and may be a compound having at least one isocyanate group.

More specifically, the compound having at least one isocyanate group is an aliphatic, cycloaliphatic, aromatic, or aromatic-aliphatic mono-, di-, tri-, or poly-isocyanate. The compound having at least one isocyanate group may be secondary products with relatively high molecular weight (oligo- and poly-isocyanates) of monomer-type di- and/or tri-isocyanates having urethane, urea, carbodiimide, acylurea, isocyanurate, allophanate, biuret, oxadiazinetrione, uretdione, or iminooxadiazinedione structures.

Specific examples of the compound having at least one isocyanate group include butylene diisocyanate, hexamethylene diisocyanate (HDI), isophorone diisocyanate (IPDI), 1,8-diisocyanato-4-(isocyanatomethyl)octane, 2,2,4- and/or 2,4,4-trimethylhexamethylene diisocyanate, isomeric bis(4,4'-isocyanato-cyclohexyl)methane, a mixture thereof with any desired isomer content, isocyanatomethyl-1,8-octane diisocyanate, 1,4-cyclohexylene diisocyanate, isomeric cyclohexane dimethylene diisocyanate, 1,4-phenylene diisocyanate, 2,4- and/or 2,6-toluene diisocyanate, 1,5-naphthylene diisocyanate, 2,4'- or 4,4'-diphenylmethane diisocyanate, and/or triphenylmethane 4,4',4''-triisocyanate, or the like.

The polyol which reacts with the compound having at least one isocyanate group to form the polymer matrix may be an aliphatic, aromatic-aliphatic, or cycloaliphatic diol, triol, and/or higher polyol having 2 to 20 carbon atoms.

The polyol may have a hydroxyl equivalent weight of 300 g/mol to 10,000 g/mol, and a weight average molecular weight of 100,000 to 1,500,0000 g/mol.

Examples of the diols include ethylene glycol, diethylene glycol, triethylene glycol, tetraethylene glycol, dipropylene glycol, tripropylene glycol, 1,2-propanediol, 1,3-propanediol, 1,4-butanediol, neopentyl glycol, 2-ethyl-2-butylpropanediol, trimethylpentanediol, positional isomers of diethyloctanediols, 1,3-butylene glycol, cyclohexanediol, 1,4-cyclohexane-dimethanol, 1,6-hexanediol, 1,2- and 1,4-cyclohexanediol, hydrogenated bisphenol A (2,2-bis(4-hydroxycyclohexyl)propane) and 2,2-dimethyl-3-hydroxypropyl, and 2,2-dimethyl-3-hydroxypropionate.

Further, examples of the triols include trimethylolethane, trimethylolpropane, and glycerol. Suitable high-functional alcohols include ditrimethylolpropane, pentaerythritol, dipentaerythritol, and sorbitol.

As the polyols, aliphatic and cycloaliphatic polyols having a relatively large molecular weight, such as polyester polyols, polyether polyols, polycarbonate polyols, hydroxy-functional acrylic resins, hydroxy-functional polyurethanes, hydroxy-functional epoxy resins, and the like may be used.

The polyester polyols may be linear polyester diols, as obtained in a known manner from aliphatic, cycloaliphatic, or aromatic di- or polycarboxylic acid or their anhydrides, for example, succinic acid, glutaric acid, adipic acid, pimelic acid, suberic acid, azelaic acid, sebacic acid, nonanedicarboxylic acid, decanedicarboxylic acid, terephthalic acid, isophthalic acid, o-phthalic acid, tetrahydrophthalic acid, hexahydrophthalic acid or trimellitic acid, and acid anhydrides such as o-phthalic anhydride, trimellitic anhydride, or succinic anhydride, or any mixtures thereof, by using polyhydric alcohols such as ethanediol, di-, tri-, or tetraethylene glycol, 1,2-propanediol, di-, tri-, or tetrapropylene glycol, 1,3-propanediol, 1,4-butanediol, 1,3-butanediol, 2,3-butanediol, 1,5-pentanediol, 1,6-hexanediol, 2,2-dimethyl-1,3-propanediol, 1,4-dihydroxycyclohexane, 1,4-dimethylolcyclohexane, 1,8-octanediol, 1,10-decanediol, 1,12-dodecanediol, or a mixture thereof, and optionally, simultaneously using higher functional polyols such as trimethylol propane or glycerol. Of course, cyclic aliphatic and/or aromatic di- and polyhydroxy compounds are suitable as polyhydric alcohols for the preparation of polyester polyols. It is also possible to use the corresponding polycarboxylic acid anhydrides of the lower alcohols or the corresponding polycarboxylates, or mixtures thereof, instead of free polycarboxylic acids in the preparation of the polyesters.

Further, the polyester polyols that can be used in the synthesis of the polymer matrix include homo- or copolymers of lactones, which are preferably obtained by an addition of lactones or lactone mixtures, such as butyrolactone, ε-caprolactone, and/or methyl-ε-caprolactone to suitable bifunctional and/or higher functional initiator molecules, such as the aforementioned polyhydric alcohols having a small molecular weight as the synthetic component for the polyester polyols.

Further, the polycarbonates having hydroxyl groups are also suitable as a polyhydroxy component for prepolymer synthesis. For example, it may be prepared by reaction of diols such as 1,4-butanediol and/or 1,6-hexanediol and/or 3-methylpentanediol with diaryl carbonates such as diphenyl carbonate, dimethyl carbonate, or phosgene.

Further, the polyether polyol that can be used for the synthesis of the polymer matrix may be, for example, polyaddition products of styrene oxides, of ethylene oxide, of propylene oxide, of tetrahydrofuran, of butylene oxide, or of epichlorohydrin, mixed addition products thereof, grafting products thereof, polyether polyols obtained by condensation of polyhydric alcohols or mixtures thereof, and those obtained by alkoxylation of polyhydric alcohols, amines and amino alcohols. Specific examples of the polyether polyol include poly(propylene oxide)s, poly(ethylene oxide)s, and combinations thereof in the form of random or block copolymers, or poly(tetrahydrofuran)s and mixtures thereof having OH functionality of 1.5 to 6 and a number average molecular weight of 200 to 18,000 g/mol, and preferably an OH functionality of 1.8 to 4.0 and a number average molecular weight of 600 to 8000 g/mol, particularly preferably an OH functionality of 1.9 to 3.1 and a number average molecular weight of 650 to 4500 g/mol.

Meanwhile, the photopolymer composition of the embodiment includes a photoinitiator. The photoinitiator is a compound which is activated by light or actinic radiation, and initiates polymerization of a compound containing a photoreactive functional group such as the photoreactive monomer.

As the photoinitiator, commonly known photoinitiators can be used without particular limitation. For example, a monomolecular (type I) initiator or a bimolecular (type II) initiator may be used.

The (type I) system for free radical photopolymerization may include, for example, an aromatic ketone compounds in combination with a tertiary amine, such as benzophenone, alkylbenzophenone, 4,4'-bis(dimethylamino)benzophenone (Michler's ketone), anthrone and halogenated benzophenone, or a mixture of these types. Initiators (type II) such as benzoin and derivatives thereof, benzyl ketal, acylphosphine oxide, for example, 2,4,6-trimethylbenzoyldiphenylphosphine oxide, bisacylophosphine oxide, phenylglyoxyl ester, camphorquinone, alpha-aminoalkylphenone, alpha,alpha-dialkoxyacetophenone, 1-[4-(phenylthio)phenyl]octane-1,2-dione 2-(O-benzoyloxime), and alpha-hydroxyalkylphenone are also suitable. A photoinitiator system composed of a mixture of ammonium aryl borate and one or more dyes may also be used as the photoinitiator.

The photopolymer composition may include: 20 wt % to 80 wt % of the polymer matrix or the precursor thereof; 10 wt % to 70 wt % of the photoreactive monomer; and 0.1 wt % to 15 wt % of the photoinitiator, or may include: 30 wt % to 70 wt % of the polymer matrix or the precursor thereof; 20 wt % to 60 wt % of the photoreactive monomer; and 0.1 wt % to 10 wt % of the photoinitiator.

The photopolymer composition may further include other additives, catalysts, and the like. For example, the photopolymer composition may further include a catalyst which is commonly known for promoting polymerization of the polymer matrix or the photoreactive monomer. Examples of the catalyst include tin octanoate, zinc octanoate, dibutyltin dilaurate, dimethylbis[(1-oxoneodecyl)oxy]stannane, dimethyltin dicarboxylate, zirconium bis(ethylhexanoate), zirconium acetylacetonate, or tertiary amines such as 1,4-diazabicyclo[2.2.2]octane, diazabicyclononane, diazabicyclo undecane, 1,1,3,3-tetramethylguanidine, 1,3,4,6,7,8-hexahydro-1-methyl-2H-pyrimido(1,2-a)pyrimidine, and the like.

Meanwhile, according to another embodiment of the present disclosure, a hologram recording medium produced from the photopolymer composition may be provided.

As described above, when the photopolymer composition of one embodiment is used, it is possible to provide holograms capable of achieving a significantly improved refractive index modulation value while having a thinner thickness, as compared with holograms previously known in the art.

In the photopolymer composition of the one embodiment, the respective components contained therein are homogeneously mixed, dried, and cured at a temperature of 20° C. or higher, and then predetermined exposure procedures are undertaken, thereby producing a hologram for optical application in the entire visible range and the near ultraviolet region (300 to 800 nm).

In the photopolymer composition of the one embodiment, the other components excluding the compound having at least one isocyanate group for forming the polymer matrix or the precursor thereof may be first homogeneously mixed, and then the compound having at least one isocyanate group may be mixed with the catalyst to prepare holograms.

In the photopolymer composition of one embodiment, a mixing device, a stirrer, a mixer, or the like which are commonly used in the art can be used for mixing the respective components contained therein without particular limitation. The temperature in the mixing process may be 0° C. to 100° C., preferably 10° C. to 80° C., and particularly preferably 20° C. to 60° C.

Meanwhile, the other components excluding the compound having at least one isocyanate group for forming the polymer matrix or the precursor thereof in the photopolymer composition of one embodiment may be first homogeneously mixed. Subsequently, at the time of adding the compound having at least one isocyanate group, the photopolymer composition may become a liquid formulation that is cured at a temperature of 20° C. or more.

The curing temperature may vary depending on the composition of the photopolymer and the curing is promoted, for example, by heating at a temperature of from 30° C. to 180° C., preferably 40° C. to 120° C., and more preferably 50° C. to 100° C.

At the time of curing, the photopolymer may be in state of being injected into or coated onto a predetermined substrate or mold.

Meanwhile, as the method of recording a visual hologram on a hologram recording medium produced from the photopolymer composition, generally known methods can be used without particular limitation. The method described in the holographic recording method of the embodiment described hereinafter can be adopted as an example.

According to another embodiment of the present disclosure, a holographic recording method may be provided, which includes selectively polymerizing photoreactive monomers contained in the photopolymer composition using electromagnetic radiation.

As described above, through the process of mixing and curing the photopolymer composition, it is possible to produce a medium in which no visual hologram is recorded, and a visual hologram can be recorded on the medium through a predetermined exposure process.

A visual hologram can be recorded on the media provided through the process of mixing and curing the photopolymer composition, using known devices and methods under commonly known conditions.

According to another embodiment of the present disclosure, an optical element including the hologram recording medium may be provided.

Specific examples of the optical element include optical lenses, mirrors, deflecting mirrors, filters, diffusing screens, diffraction elements, light guides, waveguides, holographic optical elements having projection screen and/or mask functions, media of optical memory systems and light diffusion plates, optical wavelength multiplexers, reflection-type or transmission-type color filters, and the like.

An example of the optical element including the hologram recording medium may include a hologram display device.

The hologram display device includes a light source unit, an input unit, an optical system, and a display unit. The light source unit is a part that irradiates a laser beam used for providing, recording, and reproducing three-dimensional image information of an object in the input unit and the display unit. Further, the input unit is a part that previously inputs three-dimensional image information of an object to be recorded on the display unit, and for example, three-dimensional information of an object such as the intensity and phase of light for each space can be input into an electrically addressed liquid crystal SLM, wherein an input beam (212) may be used. The optical system may include a mirror, a polarizer, a beam splitter, a beam shutter, a lens, and the like. The optical system can be distributed into an input beam for sending a laser beam emitted from the light source unit to the input unit, a recording beam for sending the laser beam to the display unit, a reference beam, an erasing beam, a reading beam, and the like.

The display unit can receive three-dimensional image information of an object from an input unit, record it on a hologram plate composed of an optically addressed SLM, and reproduce the three-dimensional image of the object. Herein, the three-dimensional image information of the object can be recorded via interference of the input beam and the reference beam. The three-dimensional image information of the object recorded on the hologram plate can be reproduced into a three-dimensional image by the diffraction pattern generated by the reading beam. The erasing beam can be used to quickly remove the formed diffraction pattern. Meanwhile, the hologram plate can be moved between a position at which a three-dimensional image is input and a position at which a three-dimensional image is reproduced.

Advantageous Effects

According to the present disclosure, a photopolymer composition which can more easily provide a photopolymer layer having a high refractive index modulation value even with a thin thickness, a hologram recording medium including a photopolymer layer having a high refractive index modulation value even with a thin thickness, an optical element including the hologram recording medium, and a holographic recording method including selectively polymerizing photoreactive monomers contained in the photopolymer composition using electromagnetic radiation are provided.

DETAILED DESCRIPTION OF THE EMBODIMENTS

Hereinafter, the present invention will be explained in detail with reference to the following examples. However, these examples are only to illustrate the invention, and the scope of the invention is not limited thereto.

Preparation Example: Synthesis of Polyol 34.5 g of methyl acrylate, 57.5 g of butyl acrylate, and 8 g of 4-hydroxybutyl acrylate were placed in a 2 L jacket reactor and diluted with 150 g of ethyl acetate. Stirring was continued for about 1 hour while maintaining the temperature of the jacket reactor at 60 to 70° C. Then, 0.035 g of n-dodecyl mercaptan was further added to the reactor, followed by further stirring for about 30 minutes. Thereafter, 0.04 g of AIBN (2,2'-azo-bisisobutyronitrile) as a polymerization initiator was added thereto, and polymerization was continued for about 4 hours at a temperature of about 70° C. until the residual acrylate-based monomer content became 1 wt % to synthesize a polyol. The obtained polyol had a weight average molecular weight using polystyrene calibration measured by GPC of about 700,000 and OH equivalent weight measured by a KOH titration method of 1802 g/OH mol.

Examples and Comparative Examples: Preparation of Photopolymer Composition 39.44 g of the polyol of the preparation example, 31.33 g of the monomer shown in Tables 1 to 2, 0.06 g of safranin O (dye, manufactured by Sigma-Aldrich), 2.01 g of N-methyl diethanolamine (manufactured by Sigma-Aldrich), 4.19 g of [4-methylphenyl-(4-(2-methylpropyl)phenyl)]iodonium hexafluorophosphate (Irgacure 250), and 0.42 g of BYK-310 (dispersant) were mixed with light blocked, and stirred with a paste mixer for about 2 minutes to obtain a transparent coating solution.

7.56 g of MFA-75X (hexafunctional isocyanate, diluted to 75 wt % in xylene, manufactured by Asahi Kasei) was added to the coating solution and further stirred for about 1 minute. DBTDL (0.05 wt % with respect to the synthesized urethane resin) as a catalyst was added thereto and stirred for about 1 minute. It was coated on a PC substrate (125 μm) using a Mayer bar to a thickness of 18 μm, and then cured at 80° C. for 30 minutes. Thereafter, the sample was allowed to stand for 12 hours or more in a dark room under constant temperature and humidity conditions of about 25° C. and 50 RH %.

Experimental Examples: Holographic Recording (1) The photopolymer-coated surfaces prepared in each of the examples and comparative examples were laminated on a slide glass, and fixed so that a laser first passed through the glass surface at the time of recording.

(2) A holographic recording was done via interference of two interference lights (reference light and object light), and a transmission-type recording was done so that the two beams were incident on the same side of the sample. The diffraction efficiencies change with the incident angle of the two beams, and become non-slanted when the incident angles of the two beams are the same. In the non-slanted recording, the diffraction grating is generated perpendicularly to the film because the incident angles of the two beams are equal to a normal line.

The recording (2θ=45°) was done in a transmission-type non-slanted manner using a laser with a wavelength of 532 nm, and the diffraction efficiency (η) was calculated according to the following Equation 1.

$$\eta = \frac{P_D}{P_D + P_T}$$ [Equation 1]

In Equation 1, η is a diffraction efficiency, $P_D$ is an output amount (mW/cm$^2$) of the diffracted beam of a sample after recording, and $P_T$ is an output amount (mW/cm$^2$) of the transmitted beam of the recorded sample.

The lossless dielectric grating of the transmission-type hologram can calculate the refractive index modulation value (Δn) from the following Equation 2.

$$\eta(DE) = \sin^2(\sqrt{v^2}) = \sin^2\left(\frac{\pi \Delta n d}{\lambda \cos\theta}\right)$$ [Equation 2]

In Equation 2, d is a thickness of the photopolymer layer, Δn is a refractive index modulation value, η(DE) is diffraction efficiency, and λ is a recording wavelength.

TABLE 1

Types of mono/polyfunctional acrylate monomer of examples and measurement results of refractive index modulation values (Δn)

| | Examples 1 to 3 | Example 1 | Example 2 | Example 3 |
|---|---|---|---|---|
| | | Types of mono/polyfunctional acrylate monomer | | |
| | Monofunctional acrylate monomer [M1142 (Miwon)] | Polyfunctional acrylate monomer [M282 (Miwon)] | Polyfunctional acrylate monomer [M284 (Miwon)] | Polyfunctional acrylate monomer [M3130 (Miwon)] |
| Refractive index | 1.59 | 1.475 | 1.476 | 1.492 |
| Tg (° C.) | 33 | 14 | −13 | 40 |
| Mw | 268 | 308 | 408 | 428 |
| Viscosity (cps, 25° C.) | 150 | 25 | 40 | 60 |
| Weight ratio relative to all monomers | | 0.2 | 0.2 | 0.2 |
| Δn | | 0.0123 | 0.0123 | 0.0122 |

TABLE 2

Types of mono/polyfunctional acrylate monomer of Comparative Examples and measurement results of refractive index modulation value (Δn)

| | Comp. Exs. 1 to 7 | Comp. Ex. 1 | Comp. Ex. 2 | Comp. Ex. 3 | Comp. Ex. 4 | Comp. Ex. 5 | Comp. Ex. 6 | Comp. Ex. 7 |
|---|---|---|---|---|---|---|---|---|
| | | | Types of mono/polyfunctional acrylate monomer | | | | | |
| | Monofunctional acrylate monomer [M1142 (Miwon)] | Polyfunctional acrylate monomer [M282 (Miwon)] | Polyfunctional acrylate monomer [M284 (Miwon)] | Polyfunctional acrylate monomer [M3130 (Miwon)] | Polyfunctional acrylate monomer [M2100 (Miwon)] | Polyfunctional acrylate monomer [M2100 (Miwon)] | Polyfunctional acrylate monomer [M244 (Miwon)] | Polyfunctional acrylate monomer [M244 (Miwon)] |
| Refractive index | 1.59 | 1.475 | 1.476 | 1.492 | 1.529 | 1.529 | 1.557 | 1.557 |
| Tg (° C.) | 33 | 14 | −13 | 40 | −7 | −7 | 67 | 67 |
| Mw | 268 | 308 | 408 | 428 | 776 | 776 | 468 | 468 |
| Viscosity (cps, 25° C.) | 150 | 25 | 40 | 60 | 660 | 660 | 1730 | 1730 |
| Weight ratio relative to all monomers | | 0.4 | 0.4 | 0.4 | 0.4 | 0.2 | 0.4 | 0.2 |
| Δn | | 0.0118 | 0.0118 | 0.0114 | 0.0115 | 0.0117 | 0.0108 | 0.0109 |

1) Measurement of Refractive Index of Monomers

Irgacure 184 (UV initiator, manufactured by Ciba) and F477 (surfactant, manufactured by DIC) were used in an amount of 0.5 wt % and 0.2 wt % relative to the monomer, respectively, to prepare a coating solution. The coating solution was coated on a glass substrate to a thickness of 2 µm and dried at 60° C. for 2 minutes. After curing by irradiating ultraviolet rays at 150 mJ/cm$^2$, the refractive index was measured at 632.8 nm using SPA-3DR.

2) Measurement of Glass Transition Temperature (Tg) of Monomers

Irgacure 184 (UV initiator, manufactured by Ciba) was used in an amount of 0.5 wt % relative to the monomer to prepare a coating solution. The coating solution was coated on a glass substrate to a thickness of 10 µm and dried at 60° C. for 2 minutes. After curing by irradiating ultraviolet rays at 150 mJ/cm$^2$, the film was peeled off and the glass transition temperature of the film was measured using DSC. Specifically, when using DSC, the temperature was increased from −100° C. to 200° C. at a rate of 10° C./min and decreased from 200° C. to −100° C. at a rate of −10° C./minute. This process was repeated twice, and the glass transition temperature was confirmed at the second heating period.

As shown in Tables 1 and 2 above, it was confirmed that the examples using a photoreactive monomer including a polyfunctional (meth)acrylate monomer having a refractive index of 1.5 or less and a viscosity at 25° C. of 100 cps or less, and a monofunctional (meth)acrylate monomer having a refractive index of 1.5 or more, wherein a content of the monofunctional (meth)acrylate monomer is 60 wt % or more, can provide holograms exhibiting a significantly improved refractive index modulation value as compared with the comparative examples even with a thin thickness.

The invention claimed is:

1. A photopolymer composition, comprising:
   a polymer matrix or a precursor thereof;
   a photoreactive monomer mixture comprising a polyfunctional (meth)acrylate monomer having a refractive index of 1.5 or less and a viscosity at 25° C. of 100 cps or less, and a monofunctional (meth)acrylate monomer having a refractive index of 1.5 or more; and
   a photoinitiator,
   wherein the content of the monofunctional (meth)acrylate monomer in the photoreactive monomer mixture is 70 wt % to 90 wt %,
   wherein the polymer matrix is a reaction product of a compound having at least one isocyanate group and a polyol, and
   wherein the polyol has a hydroxyl equivalent weight of 300 g/mol to 10,000 g/mol, and a weight average molecular weight of 100,000 to 1,500,000 g/mol.

2. The photopolymer composition of claim 1, wherein the monofunctional (meth)acrylate monomer has a viscosity at 25° C. of 300 cps or less.

3. The photopolymer composition of claim 1, wherein the polyfunctional (meth)acrylate monomer comprises an ether bond, and the monofunctional (meth)acrylate monomer comprises an ether bond and a fluorene functional group.

4. The photopolymer composition of claim 1, wherein each of the polyfunctional (meth)acrylate monomer and the monofunctional (meth)acrylate monomer has a weight average molecular weight of 50 to 1000 g/mol.

5. The photopolymer composition of claim 1, wherein a refractive index of the polymer matrix or the precursor thereof is higher than the refractive index of the polyfunctional (meth)acrylate monomer and lower than the refractive index of the monofunctional (meth)acrylate monomer.

6. The photopolymer composition of claim 1, comprising:
   20 wt % to 80 wt % of the polymer matrix or the precursor thereof;
   10 wt % to 70 wt % of the photoreactive monomer mixture; and
   0.1 wt % to 15 wt % of the photoinitiator.

7. A hologram recording medium produced from the photopolymer composition of claim 1.

8. An optical element comprising the hologram recording medium of claim 7.

9. A holographic recording method comprising selectively polymerizing the photoreactive monomer mixture contained in the photopolymer composition of claim 1 using electromagnetic radiation.

10. The photopolymer composition of claim 1, further comprising a catalyst.

11. The photopolymer composition of claim 10, wherein the catalyst is one or more selected from tin octanoate, zinc octanoate, dibutyltin dilaurate, dimethylbis[(1-oxoneodecyl)oxy]stannane, dimethyltin dicarboxylate, zirconium bis(ethylhexanoate), zirconium acetylacetonate, 1,4-diazabicyclo[2.2.2]octane, diazabicyclononane, diazabicyclo undecane, 1,1,3,3-tetramethylguanidine and 1,3,4,6,7,8-hexahydro-1-methyl-2H-pyrimido(1,2-a)pyrimidine.

12. The polymer composition of claim 1, wherein the photoinitiator is a monomolecular (type I) initiator or a bimolecular (type II) initiator.

13. The polymer composition of claim 12, wherein the monomolecular (type I) initiator is an aromatic ketone compounds in combination with a tertiary amine.

14. The polymer composition of claim 13, wherein the aromatic ketone compound is one or more selected from benzophenone, alkylbenzophenone, 4,4'-bis(dimethylamino)benzophenone (Michler's ketone), anthrone and halogenated benzophenone, and a mixture thereof.

15. The polymer composition of claim 12, wherein the bimolecular (type II) initiator is one or more selected from benzoin and derivatives thereof, benzyl ketal, 2,4,6-trimethylbenzoyldiphenylphosphine oxide, bisacylophosphine oxide, phenylglyoxyl ester, camphorquinone, α-aminoalkylphenone, α.α-dialkylacetophenone, 1-[4-(phenylthio)phenyl]octane-1,2-dione 2-(O-benzoyloxime), and α-hydroxyalkylphenone.

16. The polymer composition of claim 1, wherein the photoinitiator is a mixture of ammonium aryl borate and one or more dyes.

* * * * *